(12) United States Patent
Lee

(10) Patent No.: US 8,837,196 B2
(45) Date of Patent: Sep. 16, 2014

(54) SINGLE LAYER COMPLEMENTARY MEMORY CELL

(75) Inventor: Tsung-Wen Lee, Milpitas, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 278 days.

(21) Appl. No.: 13/217,887

(22) Filed: Aug. 25, 2011

(65) Prior Publication Data

US 2013/0051118 A1 Feb. 28, 2013

(51) Int. Cl.
*G11C 11/00* (2006.01)

(52) U.S. Cl.
USPC ........... 365/148; 165/158; 165/163; 165/171; 165/173

(58) Field of Classification Search
CPC ........ G11C 11/00; G11C 11/14; G11C 11/34; G11C 13/0004; G11C 11/16; G11C 7/00; G11C 11/02; G11C 11/15; G11C 11/56
USPC .......................... 365/148, 158, 163, 171, 173
See application file for complete search history.

(56) References Cited

U.S. PATENT DOCUMENTS

2010/0091549 A1 4/2010 Lee et al.
2010/0264397 A1* 10/2010 Xia et al. ........................ 257/4

OTHER PUBLICATIONS

Linn, Eike et al.; "Complementary resistive switches for passive nanocrossbar memories"; Nature Materials Apr. 18, 2010; pp. 403-406; vol. 9; http://www.nature.com/nmat/journal/v9/n5/pdf/nmat2748.pdf.
Lee, Tsung-Wen; "A Three-Device Non-Volatile Memory Cell"; U.S. Appl. No. 12/880,871, filed Sep. 13, 2010.

* cited by examiner

*Primary Examiner* — Hien Nguyen

(57) ABSTRACT

A single layer complementary memory cell includes a conductive base layer, a memristive matrix layer disposed onto the base layer, the memristive matrix comprising distinct memristive devices formed within. The memory cell further includes conductive lines disposed onto the memristive matrix that connect to the distinct memristive devices such that the distinct memristive devices form a mutually complementary relation to each other.

20 Claims, 8 Drawing Sheets

SINGLE LAYER COMPLEMENTARY MEMORY CELL

BACKGROUND

A crossbar memory array is one which includes a first set of conductive lines which perpendicularly intersect a second set of conductive lines. A programmable memory cell configured to store digital data is placed at each intersection of those lines. One type of device which can be used as a memory cell is a resistive switch such as a memristive device. Using memristive devices within a crossbar array brings up several design constraints. For example, when applying read/write voltages to a selected memory cell, care must be taken to prevent excessive leakage current from passing through unselected memory cells. Additionally, during read operations, leakage current through unselected cells can affect the measurements taken by a sense amplifier.

One way to reduce the leakage currents is to use a memory cell that includes multiple memristive devices which are placed in a complementary manner to each other. Two memristors that are connected in a complementary manner means that when one memristor is in a high resistive (OFF) state, then the other memristor is in a low resistive (ON) state. The combined resistance will always be in a high resistive state. This reduces the leakage current within the memory array.

Two memristive devices are typically placed in a complementary manner to each other by connecting two memristive devices in series. Thus, the two memristors share a center conductor. However, when manufacturing an integrated memristive device, the layers which form the memristive portion of the device are subject to variation. Thus, no two layers of memristive regions are exactly the same. Thus, the two memristive devices placed in such a complementary manner will have different switching characteristics. This may cause problems when building a large array of such memristive devices.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

Figure 1A:
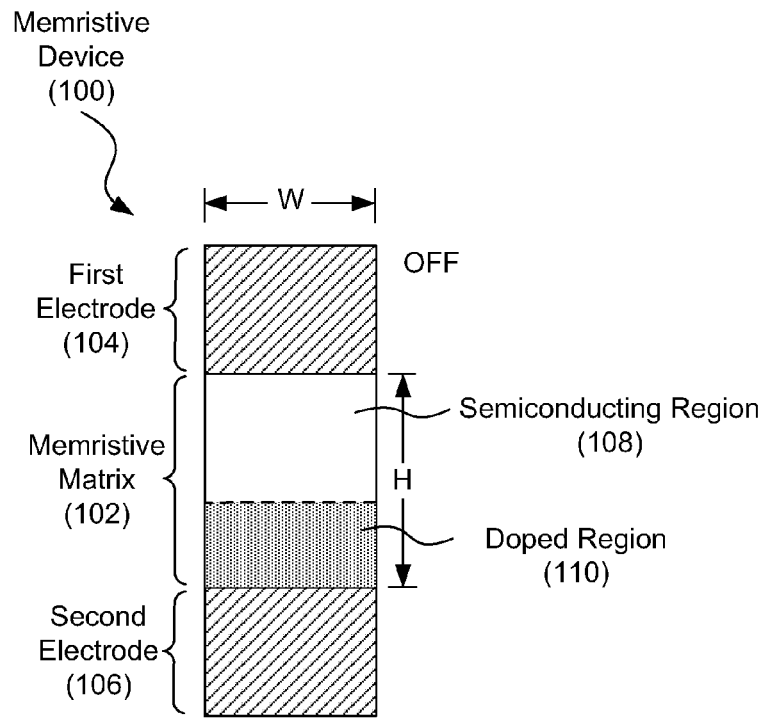
FIGS. 1A and 1B are diagrams showing illustrative states of a memristive device, according to one example of principles described herein.

As mentioned above, two memristive devices are typically placed in a complementary manner to each other by connecting two memristive devices in series. Thus, the two memristors share a center conductor. However, when manufacturing an integrated memristive device, the layers which form the memristive portion of the device are subject to variation. Thus, no two layers of memristive regions are exactly the same. Thus, the two memristive devices placed in such a complementary manner will have different switching characteristics. This may cause problems when building a large array of such memristive devices.

In light of this and other issues, the present specification discloses a single layer complementary memory cell. According to certain illustrative examples, multiple complementary memristive devices may be formed into a single memristive matrix layer. More detail on this memristive matrix layer will be provided below.

The memristive matrix layer may be placed against a base conductive layer. This base conductive layer acts as a floating node within a memory cell. Distinct memristive devices are then formed into the memristive matrix layer and connect to this base conductive node. Intersecting conductive lines are then placed onto the memristive matrix layer on the opposite side of the base conductive node. These conductive lines are placed such that the devices within the memristive matrix layer for a particular memory cell form mutually complementary relationships with each other.

In one example, the single layer complementary memory cell may be a three-device memory cell. As will be described in more detail below, such a memory cell may reduce leakage current throughout the memory array while allowing for non-destructive read operations. A three-device memory cell includes a program device used for setting the state of the memory cell, a read device used to determine the state of the memory cell, and a bit device used to actually represent the state of the memory cell. Each of these three devices may be formed into the memristive matrix layer of the single layer memory cell. Furthermore, each device may be mutually complementary to the other two devices within the memory cell.

Through use of methods and systems embodying principles described herein, a complementary memory cell may be formed within a single memristive matrix layer. Thus, each device formed within that layer shares the same characteristics as a result of being formed in the same manufacturing process. Thus, the switching characteristics of each device are equal and thus smoother operation of the memory cell is realized. This is done while still connecting the devices formed within the single memristive matrix layer in a mutually complementary manner.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Figure 1B:
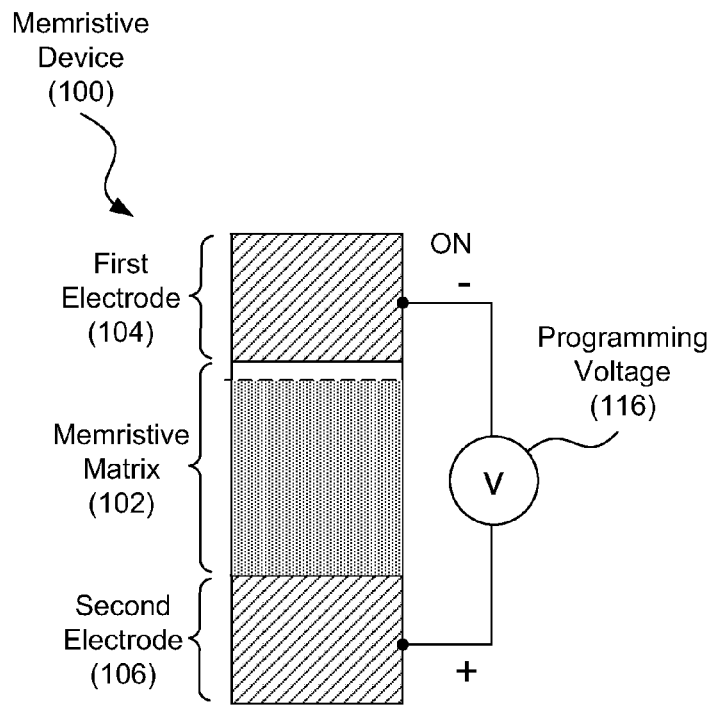

Referring now to the figures, FIGS. 1A and 1B are diagrams showing illustrative states of a memristive device. FIG. 1A is diagram showing an illustrative memristive device with no electrical conditions being applied. According to one illustrative example, the memristive device includes a first electrode (104) and a second electrode (106) in electrical and physical contact with a memristive matrix (102). The memristive matrix (102) is initially comprised of two separate regions: a semiconducting region (108) which is intentionally un-doped and a highly doped secondary region (110).

Throughout the specification and appended claims, the term "memristive matrix" describes a thin film of material that is electronically semiconducting or nominally electronically insulating and also a weakly ionic conductor. The memristive matrix (102) is capable of transporting and hosting ions that act as dopants to control the flow of electrons through the memristive device (100). The basic mode of operation is to apply an electrical field (the drift field, which may exceed a threshold for enabling the motion of the ions in the memristive matrix) across the memristive device (100). The electrical field is large enough to cause an ionic species to be transported within the memristive matrix (102) via ionic transport. The ionic species are specifically chosen from those that act as electrical dopants for the memristive matrix (102), and thereby change the electrical conductivity of the matrix from a high resistive state to a low resistive state. Furthermore, the memristive matrix (102) and the dopant species are chosen such that the drift of the dopants within the memristive matrix (102) is possible but not too facile. This ensures that the memristive device remains in whatever state it is set for a reasonably long time, perhaps many years at room temperature. Thus, the memristive device (100) is nonvolatile. A nonvolatile device is one which holds its state with or without receiving power.

The memristive matrix material (102) may be a thin film (generally less than 100 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material (102) is frequently dominated by thermionic emission and quantum mechanical tunneling of the electrons. When a semiconducting matrix material is essentially intrinsic at a junction with an electrode, the tunneling barrier is high and wide, causing the memristive device to be in a high resistive state. When a significant number of charged dopant species have been injected into or distributed throughout the semiconductor, the width and perhaps the height of the tunneling barrier are diminished by the potential of the charged dopant species. This results in an increase of the conductivity of the switch, placing the memristive device (100) in a low resistive state.

FIG. 1A illustrates one potential "as manufactured" state of the memristive device (100). The semiconducting region (108) has very few dopants and prevents electrical current from flowing between the two electrodes (104, 106). The secondary region (110) is conductive and serves as a source of dopants which can be moved into the semiconducting region (108) to change the overall electrical conductivity of the memristive matrix (102). Consequently, in the "as manufactured" state of the memristive device illustrated in FIG. 1A, the memristive device (100) is a high resistive state.

The electrodes (104, 106) may be constructed from a variety of conducting materials, including but not limited to: metals, metal alloys, metal composite materials, nanostructured metal materials, or other suitable conducting materials.

The memristive matrix (102) has a height of "H" and a width of "W" as shown in FIG. 1A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (104) and the second electrode (106) will produce the required electrical field intensity of 100,000 volts/centimeter through the memristive material (102). The application of a programming voltage above a certain threshold allows the dopants to be moved through the memristive matrix (102).

FIG. 1B is a diagram showing the memristive device (100) with a programming voltage (116) applied. The programming voltage (116) results in an electrical field which facilitates not only the movement of dopants from the highly doped region (110) into the intrinsic region (108) but also the creation of some positive dopants, such as oxygen vacancies, via an electro-reduction process in oxide memristive materials. The polarity and voltage difference which is applied across the memristive matrix (102) varies according to a variety of factors including, but not limited to: material properties, geometry, dopant species, temperature, and other factors. When the ions are positively charged, the ions are repelled by positive electrode and attracted to negative electrode. For example, a positive voltage may be applied to the second electrode (106) and negative voltage may be applied to the first electrode (104) so that the oxygen vacancies are attracted toward the first electrode. This increases the conductivity of the intrinsic region (108) placing the memristive device (100) in a low resistive state. Conversely a negative voltage to the second electrode and a positive voltage to the first electrode will repel oxygen vacancies away from the first electrode. This decreases the conductivity of the intrinsic region (108) placing the memristive device (100) in a high resistive state.

According to one illustrative example, the initial application of a programming voltage (116) to the memristive device (100) is used to form the junction and define its switching characteristics. This initial programming voltage (116) may be higher than other applied voltages used for operational purposes. The initial programming voltage (116) may serve a number of functions which prepare the junction for further use. For example, the programming voltage (116) may result in the initial creation of additional mobile dopants or the migration of the mobile dopants into more active regions of the memristive matrix (102), which reduces the effective thickness of the switching layer and causes an increased electric field with the same applied voltage. In practice the voltage creates local filamentary channels in the memristive matrix (102) that facilitate the creation and migration of the dopants. In addition, the electric field for dopant drift in the switching process is usually lower than that for dopant creation in the electroforming process. Consequently, lower programming voltages (116) can be subsequently used to move the dopants after electroforming.

Figure 2:
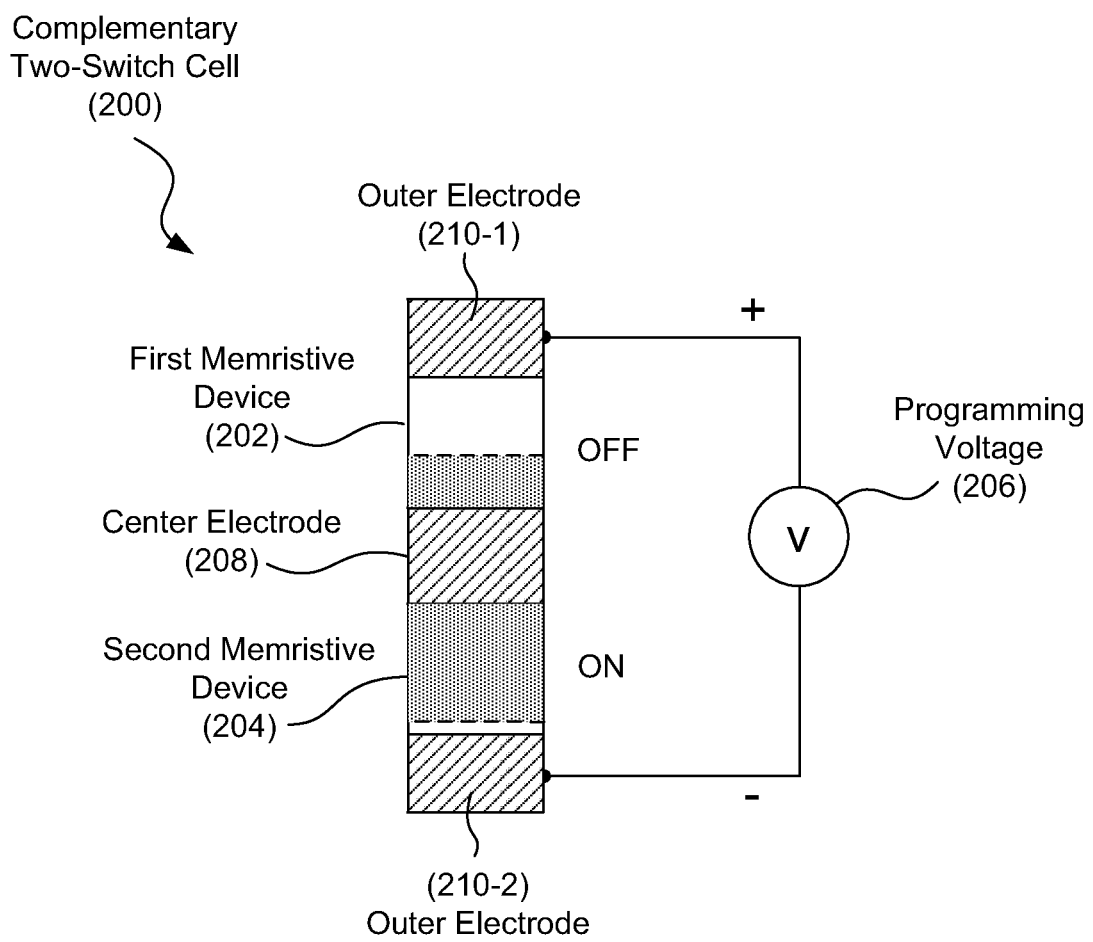
FIG. 2 is a diagram showing an illustrative multilayer complementary set of memristive devices, according to one example of principles described herein.

FIG. 2 is a diagram showing an illustrative multilayer complementary set of memristive devices. The two device complimentary set of memristive devices includes two memristive devices (202, 204) connected in series. Both memristive devices (202, 204) share a center electrode (208). The two memristive devices can be connected such that the highly doped regions of the devices are adjacent to the center electrode (208). A programming voltage (206) is applied across the two memristive devices (202, 204) to set the state of the memristive devices (202, 204). The polarity of programming voltage results in an electrical field which enhances dopant migration toward the center electrode for one memristor and away from the center electrode for the other memristor. This dopant migration switches the state of the memristive devices simultaneously in a complementary manner.

For example, the positive terminal of the programming voltage (206) is applied to the outer electrode (210-1) of the first memristive device (202) and the negative terminal of the programming voltage (206) is applied to the outer electrode (210-2) of the second memristive device. This will set the first memristive device (202) to an OFF state and set the second memristive device (204) to an ON state. When the polarity of programming voltage is reversed, the second memristive device (204) will be set to an OFF state and the first memristive device (202) will be set to an ON state simultaneously. Therefore, the combined device is always in the high resistive state. When the complementary device is used as a memory cell, the combined high resistance under the application of a programming voltage avoids programming leakage for the unselected memory cells despite the data being stored in the memory cells.

The state of the memristive devices (202, 204) can be used to represent digital data. For example, a digital '1' can be represented by the first memristive device (202) being in an ON state and the second memristive device (204) being in an OFF state. A digital '0' can be represented by the first memristive device (202) being in an OFF state and the second memristive device (204) being in an ON state.

To create an array of complementary memory cells as illustrated in FIG. 2, two layers of memristive matrix material are formed. A first layer of memristive matrix is formed that includes the bottom memristive devices. A conductive layer is formed on top of that first memristive layer. This conductive layer includes the center electrodes between the two memristors of each memory cell. Next, a second memristive matrix is formed on top of that center conductive layer. This second memristive matrix layer includes the top memristive devices of the memory cells.

As the two memristive matrix will form in a vertically asymmetric manner according to the manufacturing process, the two matrix layers will have a vertically asymmetric doping profile. The doping profile indicates the manner in which a material is doped. Additionally, in the case that the matrix includes layers of different materials, the chemical composition will be vertically anti-symmetric as well. The doping profile, chemical stoichiometry, and the matrix interface with electrodes all can affect the manner in which the memristive device switches.

The variations in the manufacturing process may be caused by a variety of factors including the deposition process and the formation of the interfaces between the memristive matrix and the electrodes. These processes may be difficult to control dues to the gas ambient and thermal budget. For example, the deposition temperature can cause dopant redistribution, dopant depletion, and even crystallization of the matrix. The gas ambient may react with the previously deposited layers causing other problems such as thickness variation. These variations will cause a difference in switching behavior between the two complementary memristive devices which may cause problems during array switching operations. In light of this issue, the present specification discloses a memory cell formed into a single matrix layer which includes multiple memristive devices in a mutually complementary relation to each other.

Figure 3A:
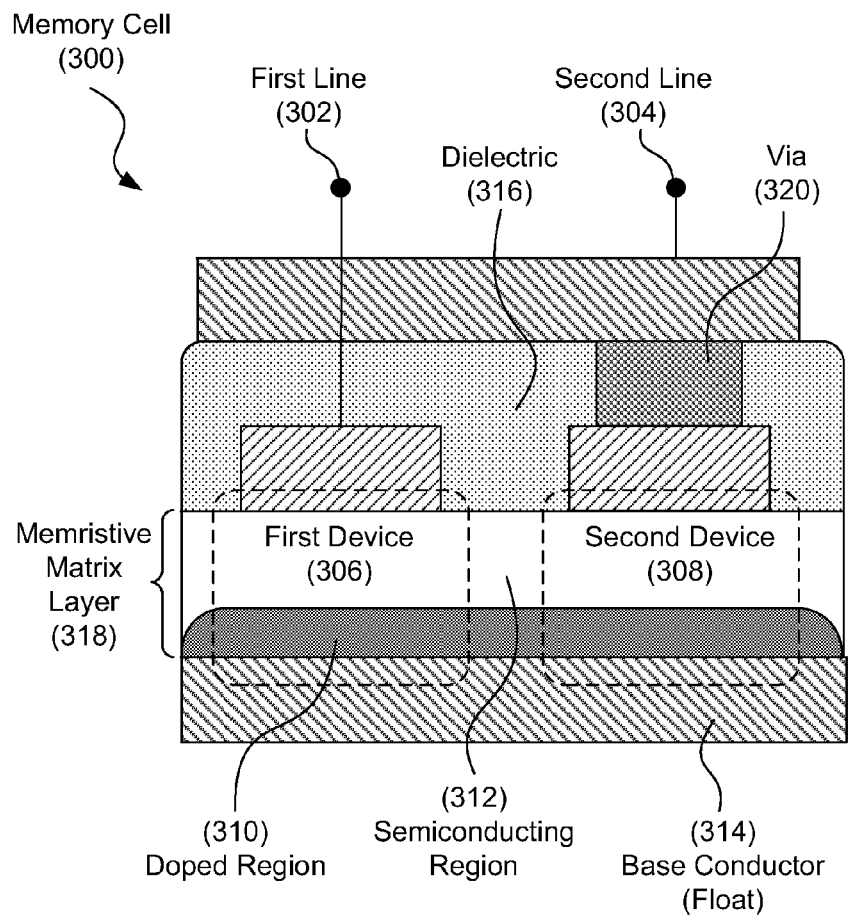
FIG. 3A is a diagram showing an illustrative cross-sectional view of a single layer complementary memory cell, according to one example of principles described herein.

FIG. 3 is a diagram showing an illustrative single layer complementary memory cell (300). In this example, the memory cell includes two memristive devices (306, 308) in a mutually complementary manner to each other. According to certain illustrative examples, the memory cell (300) includes a base conductor (314), a memristive matrix layer which includes a first device (306) and a second device (308) formed therein, and a set of conductive lines (302, 304) formed on top of the memristive matrix layer.

The base conductor may be a conductive material such as platinum. The base conductor (314) is not connected to base conductors of adjacent memory cells or any conductive lines and is thus a floating node. The base conductor (314) serves as the center electrode between the memristive devices (306, 308) within the memory cell (300).

The memristive matrix layer (318) is then formed onto the base conductor (314). The memristive matrix layer is made of a semiconductor material such as Tantalum Oxide. In order to form the memristive devices within the memristive matrix layer, the matrix layer (318) is grown with a doped region (310) and a semiconductor region (312). Each memristive device (306, 308) may be made by forming a doped region (310) on the side of the memristive matrix layer adjacent to the base conductor (314). The matrix layer and the base conductor are then patterned and isolated from the adjacent memory cells in order to avoid electrical short-out. These doped regions (310) then allow the memristive devices to function as described in FIGS. 1A and 1B.

To form the outer electrodes of the memory cell, conductive lines (302, 304) are placed on top of the memristive matrix layer (318). In one example, a first line (302) is formed along the memristive matrix layer of the first device (306). A dielectric material (316) is then formed on top of the first line (302). A second line (304) is then placed perpendicular to the first line (302) on top of the dielectric. The dielectric prevents an electrical connection between the first line (302) and the second line (304). A via (320) formed through the dielectric material (316) may be used to connect the second line (304) to the memristive matrix layer of the second device (308).

The memory cell (300) of FIG. 3 will behave similarly to the memory cell of FIG. 2. Specifically, when a voltage is applied between the first line (302) and the second line (304), the state of the first device (306) and the second device (308) will be changed accordingly. Particularly, with the positive terminal of the programming voltage applied to the first line (302), the first memristive device (306) will be set to an OFF state and the second memristive device (308) will be set to an ON state. When the polarity of programming voltage is reversed, the second memristive device (308) will be set to an OFF state and the first memristive device (306) will be set to an ON state simultaneously.

Figure 3B:
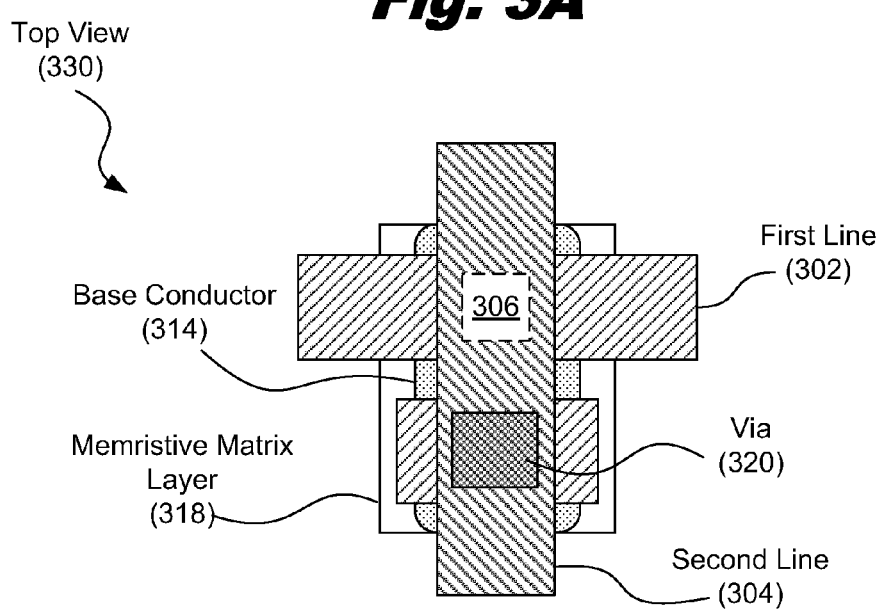
FIG. 3B is a diagram showing an illustrative top view of a single layer complementary memory cell, according to one example of principles described herein.

FIG. 3B is a diagram showing an illustrative top view (330) of a single layer complementary memory cell (300). The first line (302) is shown placed on top of the memristive matrix layer (318) which covers the base conductor (314). The memristive matrix layer is patterned and isolated from the adjacent memory cells in order to prevent the flow of electrical current between those cells. The dielectric layer (316) is placed on top of the first line and the second line (304) is formed on top of the dielectric layer (316). The second line (304) runs perpendicular to the first line (302). A via (320) connects the second line (304) to the second device (308). The first device (306) and the second device (308) are formed within the memristive matrix layer (318) and defined by the overlap regions between the base conductor (314) and the electrodes on the memristive matrix where the electrodes connect to the first line (302) and second line (304).

In order to determine the state of such a memory cell (200) with two devices, a read voltage is applied. A sense amplifier is then used to determine the state of the memory cell by measuring electric current that results from the application of the read voltage. The memory cell is always in a high resistive state whether the logic state is in a "1" or "0". A current spike is produced only when the memory cell changes state.

Most of the voltage drop across the memory cell is across the device that is in a high resistive state. Upon application of the read voltage, the first device switches from an OFF (high resistive) state to an ON (low resistive) state. This will cause a relatively large cell current to flow through the memory cell as both devices are in an ON state. The applied voltage and current then turns the other device to an OFF which stops the flow of electric current. The sense amplifier can then determine the logic state of memory cell by sensing if there is a current spike or not in response to application of the read voltage.

Application of this read voltage may also change the state of the memory device. Once the original state of the memory cell has been determined and has changed its state during the reading operation, the original state has to be written back. This destructive read slows down the speed at which a memory array using this type of memory cell is able to operate. Additionally, the destructive read unnecessarily consumes more power. To provide a complementary memory cell capable of a non-destructive read, a third device may be formed into the single layer memristive matrix layer to form a three device complementary memory cell.

Figure 4A:
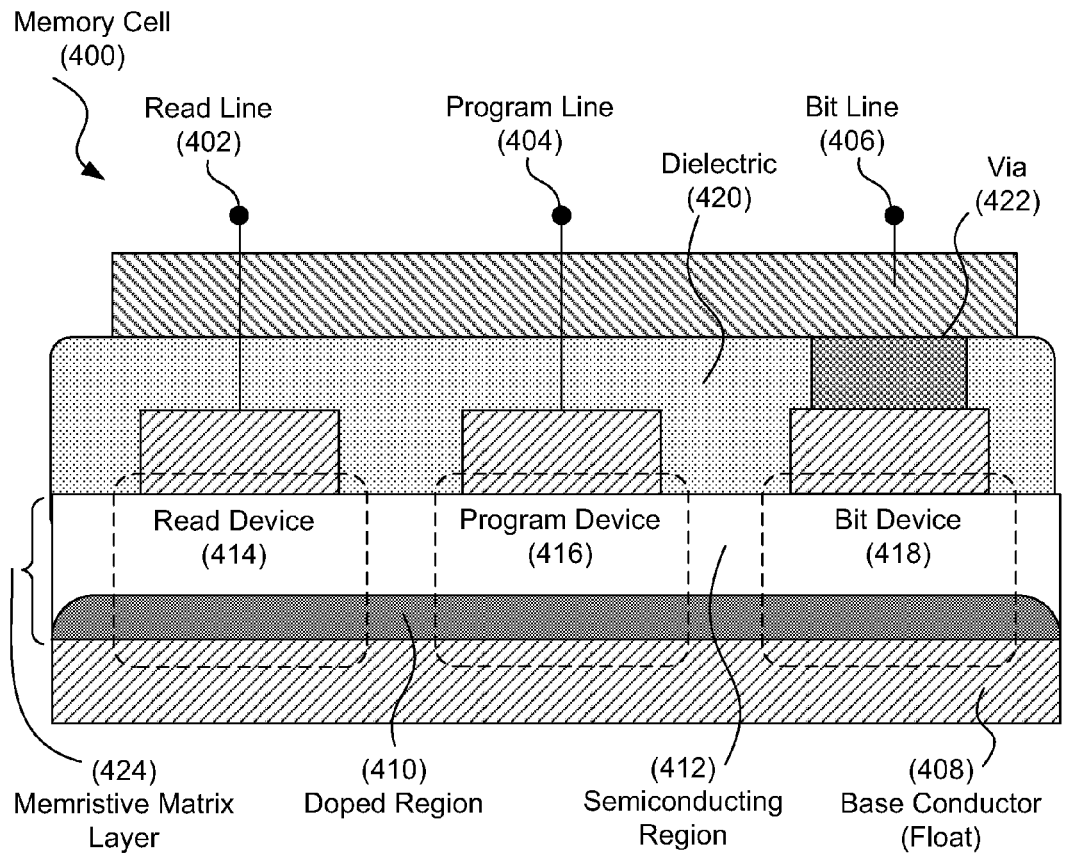
FIG. 4A is a diagram showing an illustrative cross sectional view of three-device single layer complementary memory cell with the doped region contacting the base conductor, according to one example of principles described herein.

FIG. 4A is a diagram showing an illustrative cross sectional view of three-device single layer complementary memory cell. According to certain illustrative examples, the three-device memory cell (400) includes a read device (414), a program device (416), and bit device (418). Each of these memristive devices is formed into the same memristive matrix layer (424). Furthermore, each memristive device forms a mutually complementary relationship to the other two devices within the memory cell (400). This is because the highly doped regions of each of the devices are formed against the base conductor (408) which acts as the center conductor between all three devices (414, 416, 418). Again, the base conductor (408) acts only as an intra-cell connection and does not connect to base conductors of adjacent cells or an external line.

The read device (414) is connected to a read line (402). The read device (414) is used for reading operations which will be described in more detail below. The program device (416) is connected to a program line (404) and is used for programming operations which will also be described in more detail below. The program line (404) runs parallel to the read line (402). Both the read line and the program line may be formed directly on top of the memristive matrix layer (424). A dielectric material (420) is then formed on top of the read line (402) and program line (404). A bit line (406) is then be formed on top of the dielectric material (420) and runs perpendicular to the read line (402) and program line (404). The bit line (406) may be connected to the bit device (418) by a via (422) formed through the dielectric material (420).

Figure 4B:
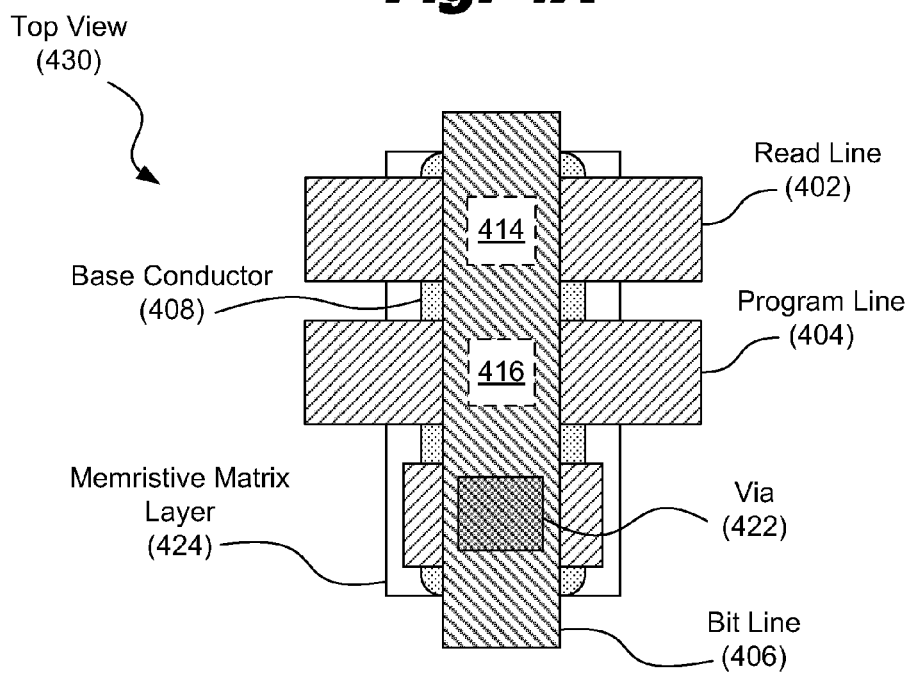
FIG. 4B is a diagram showing an illustrative top view of a three-device single layer complementary memory cell, according to one example of principles described herein.

FIG. 4B is a diagram showing an illustrative top view (430) of a three-device single layer complementary memory cell (400). The read line (402) and program line (404) are shown placed on top of the memristive matrix layer (424) which covers the base conductor (408). The memristive matrix layer is patterned and isolated from the adjacent memory cells in order to prevent the flow of electric current between those cells. The overlap regions between base conductor (408) and metal lines above it define the three memristive devices (414, 416, 418). The dielectric layer (420) is formed on top of the read line (402) and program line (404). The bit line (406) is shown placed on top of the dielectric layer (420) running perpendicular to the read line (402) and program line (404). A via (422) connects the bit line (406) to the bit device (418). The read device (414), the program device (416), and bit device (418) are formed within the memristive matrix layer underneath the intersecting conductive lines (402, 404, 406).

Figure 4C:
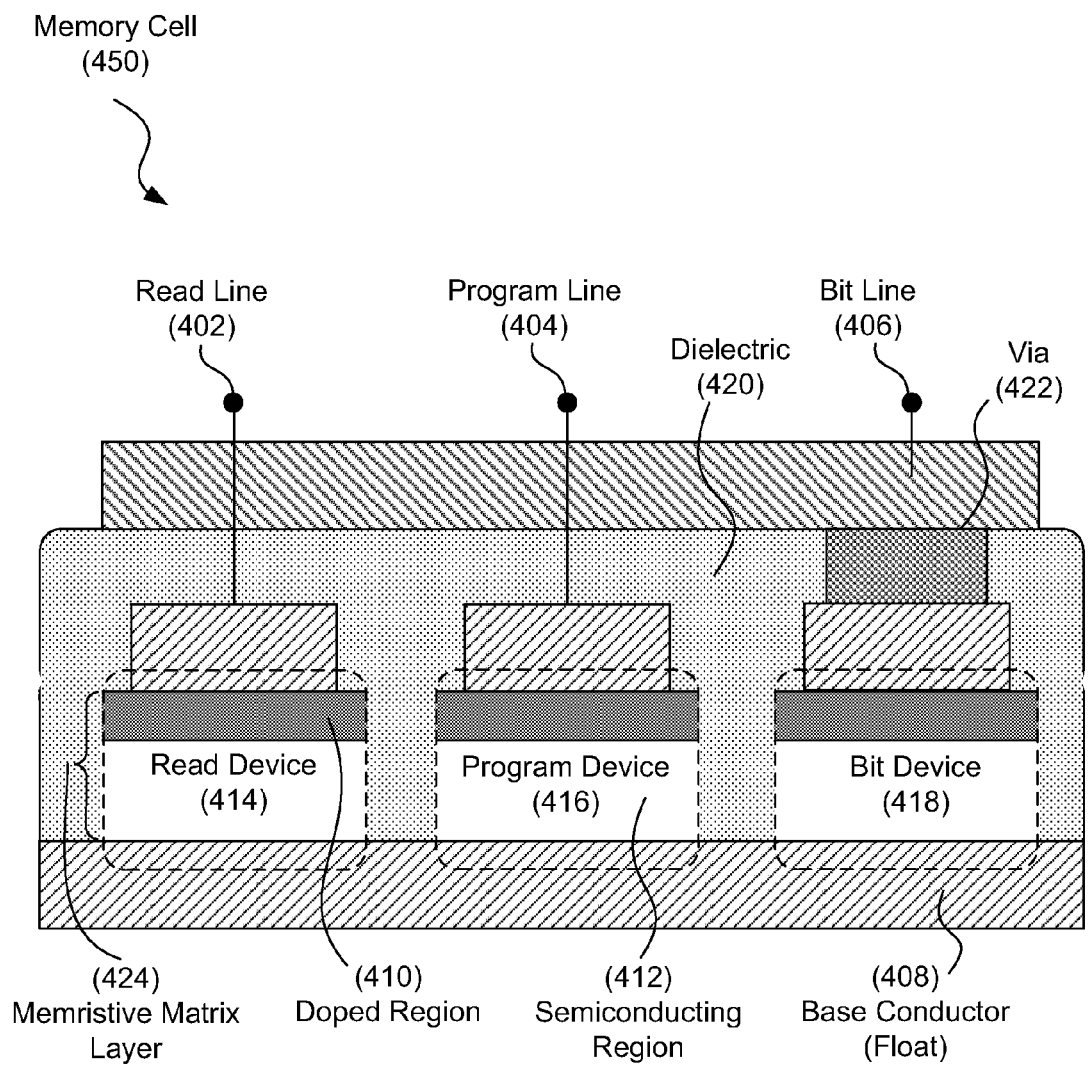
FIG. 4C is a diagram showing an illustrative cross sectional view of three-device single layer complementary memory cell with the doped region contacting the line conductors, according to one example of principles described herein.

FIG. 4C is a diagram showing an illustrative cross sectional view (450) of a three-device single layer complementary memory cell in which the doped portion of the memristive matrix is adjacent to the conductive lines rather than the base conductor (408). Each of these memristive devices is formed into the same memristive matrix layer (424). Furthermore, each memristive device forms a mutually complementary relationship to the other two memristive devices within the memory cell (450). The highly doped region (410) is a conducting layer. Thus the memristive matrix layer (424) is patterned to separate the three memristive devices (414, 416, 418) and to isolate from the adjacent memory cells in order to prevent the flow of electrical current between the adjacent devices. Again, the base conductor (408) acts only as an intra-cell connection and does not connect to base conductors of adjacent cells or an external line.

Figure 5A:
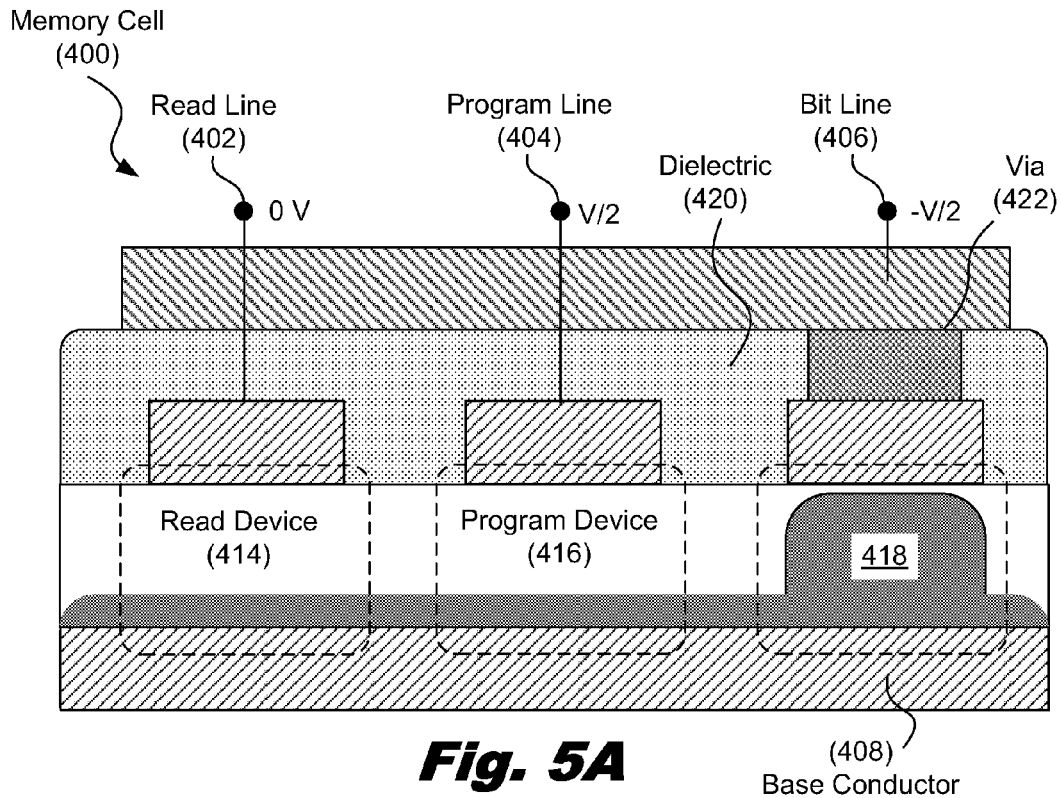
FIGS. 5A and 5B are diagrams showing an illustrative operation of a three-device single layer complementary memory cell, according to one example of principles described herein.
Figure 5B:
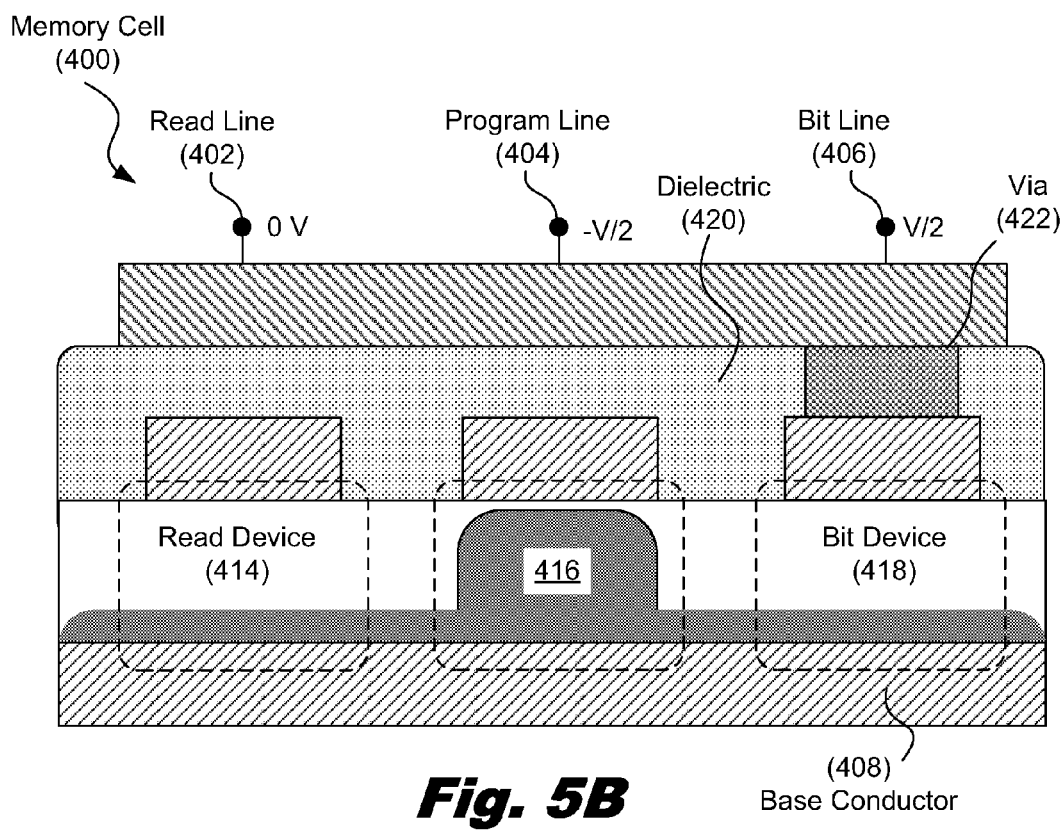

FIGS. 5A and 5B are diagrams showing an illustrative operation of a three-device single layer complementary memory cell. FIG. 5A shows the state of the memory cell (400) after programming voltages have been applied to set the bit device (418) in a low resistive (ON) state and the programming device (416) in a high resistive (OFF) state. In one example, the ON state of the bit device (418) may represent a logical '1' and the OFF state of the bit device (418) may represent a logical '0'.

FIG. 5B shows the memory cell (400) after programming voltages have been applied to set the bit device (418) in an OFF state and the program device (416) in an ON state. By applying programming voltages between the program device and the bit device in such a manner, data can be written to the memory cell by setting the state of the memory cell. While writing data to the memory cell, the read line (402) is grounded.

The programming operations of the three-device memory cell can be done by applying voltage pulses across a complementary memristive pair in the memory cell. If one device of the pair is switched from a high resistive state (OFF) to a low resistive state (ON) then the other device will be switched from a low resistive state (ON) to a high resistive state (OFF) simultaneously. Various memory cell operations including, but not limited to, initialization, reset, and write are all done by flipping complementary pairs in the three-device memory cell.

Applying one half (V/2) of the full programming voltage (V) to one terminal and applying an opposite polarity one half (−V/2) programming voltage to the other terminal can flip the complementary memristive pair. However, the programming voltage (V) is selected so that applying only one half of that programming voltage across a complementary pair will have a negligible effect on that memristor pair. When flipping any complementary pair within the three-device memory cell, the third device should be in a high resistive state. During the initialization of the memory cell, the read device is set to a high resistive state where it acts as a high resistive probe during the read operations of the three-device memory cell. Subsequent writing of data will flip the complementary pair of the bit device and the program device to represent the cell logic states.

To read the state of a memory cell (400), a read voltage is applied to the read line (402) and the bit line (406) is connected to a sense amplifier. During a read operation the current flowing into the bit line (406) is defined as cell current. If the memory cell (400) stores a logical '1', then there is a large cell current flowing into the bit line (406). This large cell current can charge up bit line capacitance and trigger the sense amplifier connected to the bit line (406). Triggering the sense amplifier can inform memory controller circuitry that the bit device (418) of the memory cell (400) is in a low resistive state and thus represents a logical '1'. When the bit device (418) is in a high resistive state, then a relatively small cell current will flow into the bit line. This small cell current may be too low to trigger the sense amplifier. Thus, the memory controller circuitry can determine that the bit device (418) of the memory cell (400) is in a high resistive state, representing a logical '0'. During read operations, the program line (404) may be grounded.

When such a memory cell is placed into a memory array, the base conductor (408) for each memory cell is segregated from the base conductor of every other memory cell. Thus, no electrical connection is made between base conductors of different memory cells. This ensures that the base conductor provides only intra-cell electrical connection.

In one example, the read device may be a passive resistive device rather than a switching device. For example, the read device may behave as a high resistance probe. This will still allow reading operations to be made without having a destructive read. However, there may be additional material and processing constraints.

Figure 6:
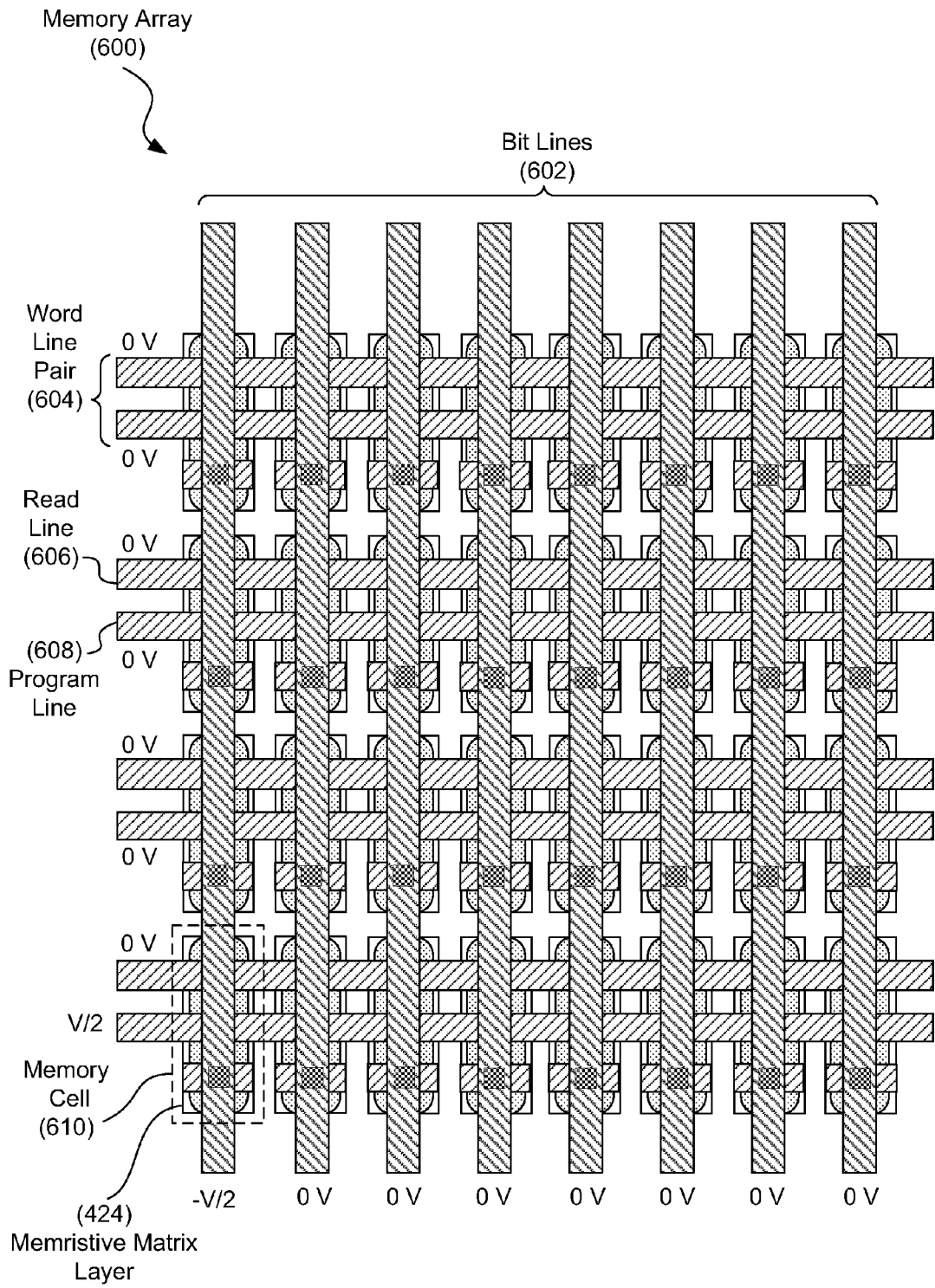
FIG. 6 is a diagram showing an illustrative memory array of three-device single layer complementary memory cells, according to one example of principles described herein.

FIG. 6 is a diagram showing an illustrative memory array of three-device single layer complementary memory cells. According to certain illustrative examples, each memory cell (610) within a memory array (600) may be a three-device single layer complementary memory cell (400). Such a memory array (600) may be used to store digital data. The memory array (600) includes a set of bit lines (602) intersecting word line pairs (604). Each word line pair (604) includes a read line (606) and a program line (608). A memory cell (610) is thus located at each intersection between a bit line (602) and a word line pair (604).

Computer processing architecture is designed to operate on groups of bits rather than individual bits. These groups of bits are referred to as words. The architecture of a memory array is designed so that the bits within a particular word are stored along a particular word line. In the example shown in FIG. 6, the memory array includes four words, each word including eight bits. This memory array is used for illustration purposes only. A practical memory array may include a much larger number of words having a much greater number of bits.

The process of writing data to the memory array is typically performed word by word. Thus, to set the state of memory cells belonging to a particular word, half of a program voltage may be applied to the program line (608) while the other half of the voltage with an inverted polarity may be applied to the bit lines (602) that correspond to memory cells along that word line that are to be changed. The unselected word line pairs (604) and the unselected bit lines (602) are connected to ground.

Likewise, the process of reading data to a memory array is typically done word by word. Thus, to read a word from memory, a read voltage may be applied to the read line (606) while each bit line along a particular word is connected to a sense amplifier. The memory controller circuitry can then determine the state of each bit along the selected word line simultaneously. The unselected word line pairs (604) are connected to ground while the unselected bit lines (602) are left unconnected and floating. Due to this operation of reading and writing to memory in words, the read lines (606) and the program lines (608) run parallel to each other and the bit lines (602) run perpendicular to those lines (606, 608).

Figure 7:
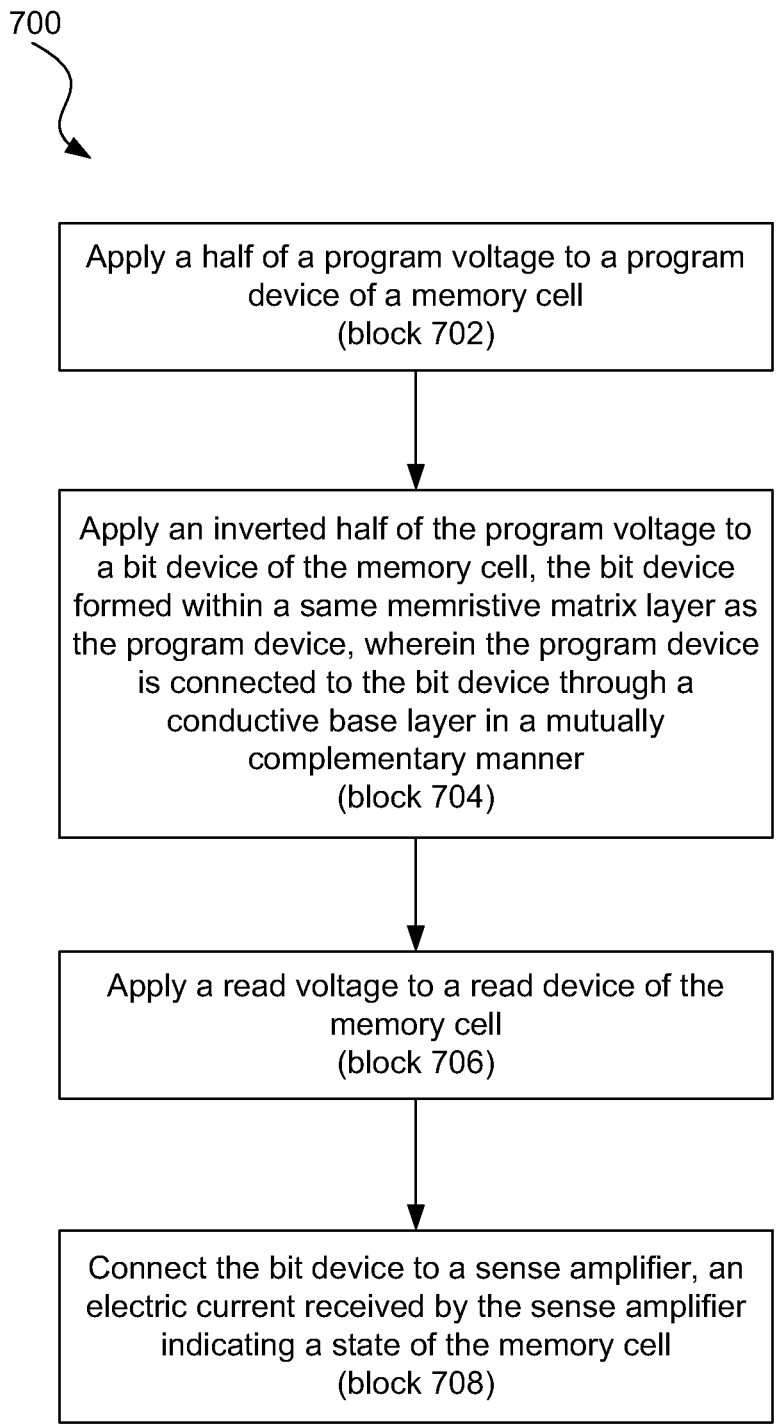
FIG. 7 is a flowchart showing an illustrative method for using a single layer complementary memory cell, according to one example of principles described herein.

FIG. 7 is a flowchart showing an illustrative method (700) for using a single layer complementary memory cell. According to certain illustrative examples, the method includes applying (block 702) a half of a program voltage to a program device of a memory cell and applying (block 704) an inverted half of the program voltage to a bit device of the memory cell, the bit device is formed within a same memristive matrix layer as the program device. The program device is connected to the bit device through a conductive base layer in a mutually complementary manner. To read the state of a memory cell, the method further includes, applying (block 706) a read voltage to a read device of the memory cell and connecting (block 708) the bit device to a sense amplifier, an electric current received by the sense amplifier indicating a state of the memory cell.

In conclusion, through use of methods and systems embodying principles described herein, a complementary memory cell may be formed within a single memristive matrix layer. Thus, each device formed within that layer shares the same characteristics as a result of being formed in the same manufacturing process. The multiple devices formed into a large array will have consistent switching characteristics such as switching voltage, switching current, OFF-to-ON resistance ratio, current-to-voltage nonlinearity, retention and endurance. As the switching characteristics of each device are equal, smoother operation of the memory array is realized. This is done while still connecting the devices formed within the single memristive matrix layer in a mutually complementary manner.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A memory device comprising:
  a conductive base layer;
  a single memristive matrix layer disposed onto said base layer, said memristive matrix comprising distinct memristive devices; and
  conductive lines disposed onto said memristive matrix that connect to said distinct memristive devices such that multiple distinct memristive devices are grouped together and connected so as to form a single memory cell.

2. The memory device of claim 1, wherein said single memory cell comprises three memristive devices.

3. The memory device of claim 2, wherein said three memristive devices comprise a read device to read a state of said memory cell, a program device to set said state of said memory cell, and a bit device to maintain said state of said memory cell.

4. The memory device of claim 3, wherein one of said conductive lines connected to said read device is parallel to one of said conductive lines connected to said program device and is perpendicular to one of said conductive lines connected to said bit device.

5. The memory device of claim 1, wherein one of said conductive lines is selectively connected to a voltage supply to supply half of a program voltage and a different one of said conductive lines is selectively connected to a voltage supply to supply an inverted half of said program voltage, said program voltage to set a state of said single memory cell.

6. The memory device of claim 1, wherein one of said conductive lines is selectively connected to a voltage supply to supply a read voltage and a different one of said conductive lines is selectively connected to a sense amplifier to sense an electric current resulting from application of said read voltage, said electric current indicating a state of said single memory cell.

7. The memory device of claim 1, comprising an array of memory cells, wherein each memory cell comprises multiple distinct memristive devices in said memristive matrix.

8. A memory cell comprising:
a conductive base layer;
a memristive matrix layer disposed onto said base layer, said memristive matrix comprising distinct memristive devices; and
conductive lines disposed onto said memristive matrix that connect to said distinct memristive devices such that said distinct memristive devices form a mutually complementary relation to each other;
wherein said memory cell comprises three memristive devices, each memristive device being in a mutually complementary relation to other memristive devices within said memory cell.

9. The memory cell of claim 8, wherein said three memristive devices comprise a read device to read a state of said memory cell, a program device to set said state of said memory cell, and a bit device to maintain said state of said memory cell.

10. The memory cell of claim 9, wherein one of said conductive lines connected to said read device is parallel to one of said conductive lines connected to said program device and is perpendicular to one of said conductive lines connected to said bit device.

11. The memory cell of claim 8, wherein one of said conductive lines is selectively connected to a voltage supply to supply half of a program voltage and a different one of said conductive lines is selectively connected to a voltage supply to supply an inverted half of said program voltage, said program voltage to set a state of said memory cell.

12. The memory cell of claim 8, wherein one of said conductive lines is selectively connected to a voltage supply to supply a read voltage and a different one of said conductive lines is selectively connected to a sense amplifier to sense an electric current resulting from application of said read voltage, said electric current indicating a state of said memory cell.

13. A memory array comprising:
a conductive base layer;
a memristive matrix layer disposed onto said base layer, said memristive matrix layer comprising a number of memory cells formed within, each memory cell comprising three distinct memristive devices, each memristive device within one of said memory cells being mutually complementary to other memristive devices within that memory cell; and
intersecting conductive lines disposed onto said memristive matrix layer such that each conductive line is connected to one memristive device of multiple memory cells.

14. The memory array of claim 13, wherein said three memristive devices of a memory cell comprise a read device used in a read process, a program device used in a program process, and a bit device used to store a logical state of that memory cell.

15. The memory array of claim 14, wherein conductive lines connected to said read devices within some of said memory cells are parallel to conductive lines connected to said program devices within some of said memory cells and are perpendicular to conductive lines connected to said bit devices within some of said memory cells.

16. The memory array of claim 15, wherein conductive lines connected to said program devices are selectively connected to a voltage supply to supply half of a program voltage and a conductive lines connected to said bit devices are selectively connected to a voltage supply to supply an inverted half of said program voltage, said program voltage to set a state of one of said memory cells.

17. The memory array of claim 15, wherein conductive lines connected to said read devices are selectively connected to a voltage supply to supply a read voltage and conductive lines connected to said bit devices are selectively connected to a sense amplifier to sense an electric current resulting from application of said read voltage, said electric current indicating a state of said memory cells.

18. A method for using the memory array of claim 13, the method comprising,
applying a first half of a program voltage to a program device of first of said memory cells; and
applying an inverted half of said program voltage to a bit device of said first memory cell, said bit device formed within a same memristive matrix layer as said program device;
wherein, said program device is connected to said bit device through a conductive base layer in a mutually complementary manner.

19. The method of claim 18, further comprising:
applying a read voltage to a read device of said first memory cell; and
connecting said bit device to a sense amplifier, an electric current received by said sense amplifier indicating a state of said memory cell.

20. The method of claim 19, wherein a conductive line connected to said program device is parallel to a conductive line connected to said read device and is perpendicular to a conductive line connected to said bit device.

* * * * *